(12) United States Patent
Jeng et al.

(10) Patent No.: US 10,290,590 B2
(45) Date of Patent: May 14, 2019

(54) STACKED SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Shin-Puu Jeng, Hsinchu (TW); Tzu-Jui Fang, Hsinchu (TW); Hsi-Kuei Cheng, Hsinchu County (TW); Chih-Kang Han, Hsin-Chu (TW); Yi-Jen Lai, Hsinchu (TW); Hsien-Wen Liu, Hsinchu (TW); Yi-Jou Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/485,530

(22) Filed: Apr. 12, 2017

(65) Prior Publication Data
US 2018/0151512 A1 May 31, 2018

Related U.S. Application Data

(60) Provisional application No. 62/427,702, filed on Nov. 29, 2016.

(51) Int. Cl.
*H01L 23/58* (2006.01)
*H01L 23/00* (2006.01)
(Continued)

(52) U.S. Cl.
CPC ........ *H01L 23/562* (2013.01); *H01L 21/4853* (2013.01); *H01L 21/563* (2013.01);
(Continued)

(58) Field of Classification Search
CPC ....... H01L 23/562; H01L 24/13; H01L 25/50; H01L 21/565; H01L 21/486; H01L 21/4853; H01L 25/105; H01L 23/5389; H01L 23/5386; H01L 23/5384; H01L 23/3114; H01L 23/373; H01L 2224/13025; H01L 2225/10
See application file for complete search history.

(56) References Cited

U.S. PATENT DOCUMENTS 8,802,504 B1 8/2014 Hou et al.
8,803,292 B2 8/2014 Chen et al.
(Continued)

*Primary Examiner* — Ismail A Muse
(74) *Attorney, Agent, or Firm* — WPAT, P.C., Intellectual Property Attorneys; Anthony King

(57) ABSTRACT

A semiconductor device includes: a first dielectric layer having a first surface; a molding compound disposed on the first surface of the first dielectric layer; a second dielectric layer having a first surface disposed on the molding compound; a via disposed in the molding compound; and a first conductive bump disposed on the via and surrounded by the second dielectric layer; wherein the first dielectric layer and the second dielectric layer are composed of the same material. The filling material has a thickness between the second dielectric layer and the semiconductor die, and the diameter of the hole is inversely proportional to the thickness of the filling material.

18 Claims, 15 Drawing Sheets

(51) Int. Cl.
- *H01L 21/48* (2006.01)
- *H01L 21/56* (2006.01)
- *H01L 23/31* (2006.01)
- *H01L 23/373* (2006.01)
- *H01L 23/538* (2006.01)
- *H01L 25/10* (2006.01)
- *H01L 25/00* (2006.01)
- *H01L 25/065* (2006.01)
- *H01L 23/498* (2006.01)

(52) U.S. Cl.
CPC ........ *H01L 21/565* (2013.01); *H01L 23/3114* (2013.01); *H01L 23/373* (2013.01); *H01L 23/49894* (2013.01); *H01L 23/5386* (2013.01); *H01L 23/5389* (2013.01); *H01L 24/13* (2013.01); *H01L 25/0655* (2013.01); *H01L 25/105* (2013.01); *H01L 25/50* (2013.01); *H01L 21/486* (2013.01); *H01L 23/3128* (2013.01); *H01L 23/5384* (2013.01); *H01L 2224/13025* (2013.01); *H01L 2225/1011* (2013.01); *H01L 2225/1035* (2013.01); *H01L 2225/1058* (2013.01); *H01L 2924/07025* (2013.01); *H01L 2924/3511* (2013.01)

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2002/0066952 A1* | 6/2002 | Taniguchi | H01L 23/3128 257/698 |
| 2005/0184377 A1* | 8/2005 | Takeuchi | H01L 21/6835 257/686 |
| 2007/0099341 A1* | 5/2007 | Lo | H01L 21/568 438/106 |
| 2011/0100692 A1* | 5/2011 | Topacio | H05K 3/3436 174/260 |
| 2012/0032347 A1* | 2/2012 | Chang | H01L 24/96 257/777 |
| 2013/0099377 A1* | 4/2013 | Yu | H01L 21/563 257/737 |
| 2014/0061937 A1* | 3/2014 | Hu | H01L 24/19 257/774 |
| 2014/0110856 A1* | 4/2014 | Lin | H01L 24/19 257/774 |
| 2014/0252646 A1* | 9/2014 | Hung | H01L 23/481 257/774 |
| 2015/0017764 A1* | 1/2015 | Lin | H01L 23/3128 438/107 |
| 2015/0021751 A1* | 1/2015 | Paek | H01L 24/81 257/676 |
| 2016/0233194 A1* | 8/2016 | Chen | H01L 21/6835 |
| 2017/0047279 A1* | 2/2017 | Hu | H01L 23/49838 |
| 2017/0084589 A1* | 3/2017 | Kuo | H01L 25/105 |

* cited by examiner

STACKED SEMICONDUCTOR DEVICE AND METHOD OF MANUFACTURING THE SAME

CROSS-REFERENCE TO RELATED APPLICATION

This application claims the benefit of U.S. Provisional Application No. 62/427,702, filed Nov. 29, 2016.

BACKGROUND

During the operations of packaging a semiconductor device, an integrated circuit may vertically couple to a memory circuit to allow higher component density in devices, such as mobile phones. The semiconductor device is assembled with numbers of integrated components including various materials with difference in thermal properties. As such, the integrated components are in undesired configurations after curing of the semiconductor device. The undesired configurations would lead to yield loss of the semiconductor devices, poor bonding between the components, development of cracks, delamination of the components or etc. As a complexity of the manufacturing operations of the semiconductor device is increased, there are more challenges to modify a structure of the semiconductor device and improve the manufacturing operations. As such, there is a need to provide a novel semiconductor package assembly to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
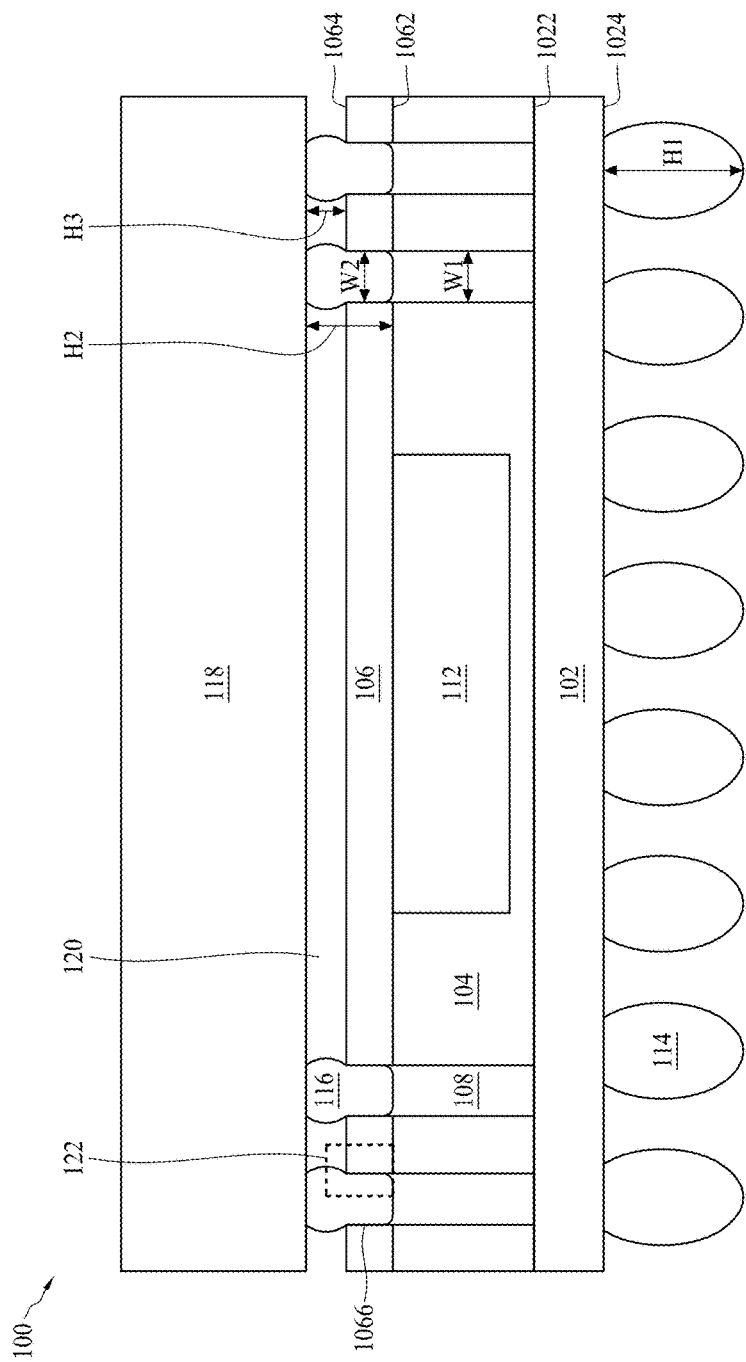
FIG. 1A is a diagram illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a diagram illustrating a semiconductor device 100 in accordance with some embodiments. The semiconductor device 100 is a wafer-level packaging semiconductor device. The semiconductor device 100 may be a stacked semiconductor device or a 3-dimensional (3D) packaging semiconductor device. For brevity, FIG. 1A merely shows a portion of the cross-sectional view of the wafer-level packaging semiconductor device. For example, the semiconductor device 100 comprises at least one DRAM circuit stacked on a system-on-chip (SOC). According to some embodiments, the semiconductor device 100 comprises a first dielectric layer 102, a molding compound 104, a second dielectric layer 106, a plurality of vias 108, a first semiconductor die or chip 112, a plurality of first conductive bumps 114, a plurality of second conductive bumps 116, a second semiconductor die or chip 118, and a filling material 120. The first dielectric layer 102 has a first surface 1022 and a second surface 1024 opposite to the first surface 1022. The first conductive bumps 114 are disposed on the second surface 1024 of the first dielectric layer 102. The vias 108 are disposed on the first surface 1022 of the first dielectric layer 102. The molding compound 104 is disposed on the first surface 1022 and is arranged to surround the first vias 108. The second dielectric layer 106 has a first surface 1062 and a second surface 1064 opposite to the first surface 1062. The second dielectric layer 106 is disposed on the molding compound 104 by the first surface 1062. The second conductive bumps 116 are disposed in the second dielectric layer 106, and are contacted and aligned with the vias 108 respectively. According to some embodiments, the first dielectric layer 102 and the second dielectric layer 106 are composed of the same material. For example, the first dielectric layer 102 and the second dielectric layer 106 are composed of low-temperature polyimide. The low-temperature polyimide layers may be cured in convection or diffusion ovens at a temperature of 230° C. to assure adequate mechanical and electrical properties. According to some embodiments, the first dielectric layer 102 is an inter-metal dielectric layer, in which a plurality of metal paths and vias are patterned therein. The metal paths and vias may be arranged to electrically connect the first semiconductor die 112, the vias 108, and/or the first conductive bumps 114. The second dielectric layer 106 is a single layer of dielectric. However, this is not a limitation of the present invention. The second dielectric layer 106 may also be an inter-metal dielectric layer having a plurality of metal paths and vias formed therein.

Furthermore, the first semiconductor die 112 is disposed between the first dielectric layer 102 and the second dielectric layer 106. The vias 108 are disposed around the first semiconductor die 112. The molding compound 104 is arranged to surround the vias 108 and the first semiconductor die 112. According to some embodiments, the first semiconductor die 112 has a first surface facing the first surface 1022 of the first dielectric layer 102, and a second surface facing the first surface 1062 of the second dielectric layer 106. The first surface of the first semiconductor die 112 may electrically couple to the first surface 1022 of the first dielectric layer 102, and/or the second surface of the first semiconductor die 112 may electrically couple to the first surface 1062 of the second dielectric layer 106.

In addition, the second dielectric layer 106 is arranged to have a plurality of holes 1066 for receiving the second conductive bumps 116 respectively. The holes 1066 penetrate from the first surface 1062 to the second surface 1064. The second conductive bumps 116 are disposed into the holes 1066 for contacting the vias 108 respectively. According to some embodiments, the vias 108 are composed of copper, and the second conductive bumps 116 are composed of solder. However, this is not a limitation of the present invention. The vias 108 and the second conductive bumps 116 may be composed of the same conductive materials. Furthermore, each of the vias 108 is arranged to have a first width (or diameter) W1. Each of the holes 1066 is a second width W2. According to some embodiments, the first width W1 is the same as the second width W2. However, this is not a limitation of the present invention. The first width W1 may be different from the second width W2. For example, the second width W2 may be smaller than the first width W1 or the second width W2 may be greater than the first width W1.

The second semiconductor die 118 is disposed on the second conductive bumps 116. The filling material 120 is disposed between the second dielectric layer 106 and the second semiconductor die 118. The filling material 120 is arranged to surround the upper parts of the second conductive bumps 116. The upper parts of the second conductive bumps 116 are protruded from the second surface 1064 of the second dielectric layer 106. The first conductive bump 114 has a first height H1 and the second conductive bump 116 has a second height H2. According to some embodiments, the first height H1 is greater than the second height H2, and/or the volume of the first conductive bumps 114 is greater than the volume of the second conductive bumps 116.

A plurality of conductive paths are formed in the first dielectric layer 102. The conductive paths are patterned metal layers to provide electrical connection among the first vias 108, the first conductive bumps 114, and/or the first semiconductor die 112. According to some embodiments, a plurality of patterned metal layers may be formed in the second dielectric layer 106, and the plurality of patterned metal layers may electrically connect to the first semiconductor die 112.

Thermal expansion is the tendency of matter to change in shape, area, and volume in response to a change in temperature, through heat transfer. The degree of expansion divided by the change in temperature is called the material's coefficient of thermal expansion and generally varies with temperature. According to some embodiments, when the front side layer (i.e. the first dielectric layer 102) and the back side layer (i.e. the second dielectric layer 106) of the first semiconductor die 112 are composed of the same material (i.e. the low-temperature polyimide), the coefficient of thermal expansions of the front side layer and the back side layer of the first semiconductor die 112 are substantially the same. Accordingly, the semiconductor device 100 has no noticeable warpage during a reflow operation or a high temperature operation. For example, during the reflow operation, the temperature is changed from 25° C. to 260° C. Afterwards, the temperature backs to 25° C. from 260° C. When the warpage issue of the semiconductor device is solved, the reliability of the second conductive bumps 116 is also improved. Therefore, the second conductive bumps 116 can firmly attach to the second vias 108 and the second semiconductor die 118 without facing the popcorn issue.

In addition, according to some embodiments, when the second width W2 is equal to the first width W1, the second conductive bump 116 may have a relatively large area to contact with a corresponding via 108. When the second width W2 of the hole 1066 is relatively large, the height H2 of the second conductive bump 116 can be reduced after the reflow operation. According to some embodiments, the holes 1066 on the second dielectric layer 106 may be drilled by laser. When the height H2 of the second conductive bump 116 is reduced, the gap height H3 between the second dielectric layer 106 and the second semiconductor die 118 can be reduced to a relatively small height, e.g. 93 um, which is good for capillarity effect and better underfill fluidity during the operation of filling the filling material 120 into the gap between the second dielectric layer 106 and the second semiconductor die 118. Accordingly, the filling material 120 has relatively low void ratio in between the second dielectric layer 106 and the second semiconductor die 118. The voids may be regarded as moisture inside the filling material 120. It is noted that the voids in the filling material 120 may cause the popcorn package cracking issue during the reflow operation of the high temperature operation (e.g. 25° C.~260° C.~25° C. if the void ratio is too high.

Moreover, when the gap height (i.e. the second height H2) between the second dielectric layer 106 and the second semiconductor die 118 is relatively small, the quantity or dispense amount of filling material 120 used to fill the gap between the second dielectric layer 106 and the second semiconductor die 118 is also reduced. Accordingly, the material cost of the semiconductor device 100 can be reduced. When diameter of the hole 1066 on the second dielectric layer 106 is larger, the gap between the second dielectric layer 106 and the second semiconductor die 118 is smaller. This is because the height H2 of the second conductive bump 116 is reduced. Therefore, the diameter W2 of the hole 1066 is inversely proportional to the thickness of the filling material 120. It is noted that the diameter W2 of the hole 1066 may be measured from the top opening, the bottom opening, or any intermediate height of the hole 1066, and this is not a limitation of the present embodiment. The filling material 120 has a thickness H3 between the second dielectric layer 106 and the semiconductor die 118, and the diameter W2 of the hole 1066 is inversely proportional to the thickness H3 of the filling material 120.

According to some semiconductor package devices, the front side dielectric layer and the back side dielectric layer are composed of different materials. For example, in an experimental semiconductor package device, the front side dielectric layer is formed by the low-temperature polyimide, and the back side dielectric layer is formed by an ultra-low cure polybenzoxazole (PBO), wherein the curing temperature of the ultra-low cure polybenzoxazole is about 200~220° C. When the back side dielectric layer is formed by the ultra-low cure polybenzoxazole, the diameter of the hole formed in the ultra-low cure polybenzoxazole layer is much smaller than the diameter (i.e. the second width W2) of the hole 1066, and the height between the ultra-low cure polybenzoxazole layer and a DRAM circuit is greater than the height H3. For example, the first width W1 of the via 108 (i.e. the diameter of the TIV cupper diameter) is about 190 um, the second width W2 of the second conductive bump 116 surrounded by the second dielectric layer 106 is about 158 um. However, when the back side dielectric layer is formed by the ultra-low cure polybenzoxazole, the width of the conductive bump surrounded by the ultra-low cure polybenzoxazole is about 150 um. Therefore, the diameter of the hole formed in the ultra-low cure polybenzoxazole layer is about 7~10 um smaller than the second width W2. Moreover, the height between the ultra-low cure polybenzoxazole layer and the DRAM die is about 8 um greater than the height H3. When the gap between the DRAM circuit and the ultra-low cure polybenzoxazole layer is relatively large, the experimental semiconductor package device has poorer underfill capillarity and fluidity effects than the present embodiments during the filling operation. The poorer underfill capillarity and fluidity effects may result in high underfill void ratio and creeping issues of the experimental semiconductor package device. Moreover, the dispense amount of filling material used to fill the gap between the DRAM circuit and the ultra-low cure polybenzoxazole layer is also greater than the present embodiments.

Figure 1B:
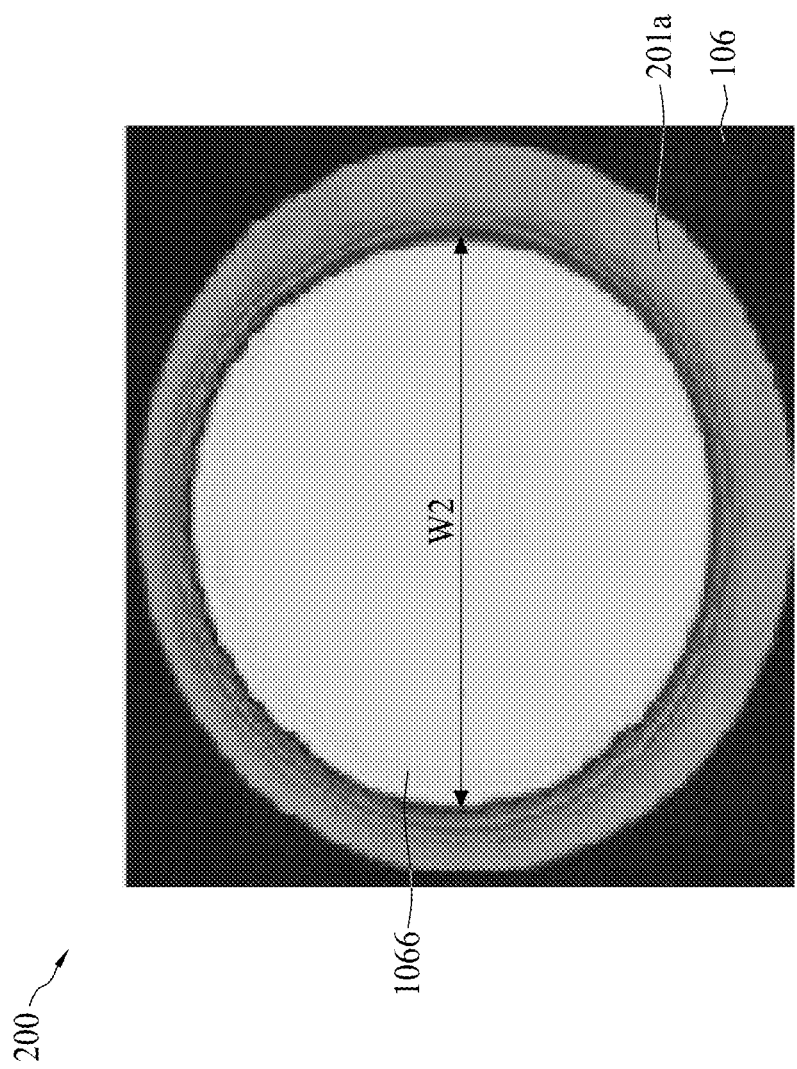
FIG. 1B is a diagram illustrating a top view of the hole in FIG. 1A according to some embodiments.

FIG. 1B is a diagram illustrating a top view 200 of the hole 1066 in FIG. 1A according to some embodiments. According to some embodiments, the hole 1066 is drilled by laser. Therefore, the sidewall 201a of the hole 1066 is a relatively smooth sidewall in comparison to a hole formed by related arts. According to some embodiments, the diameter W2 of the hole 1066 is about 158 um.

Figure 1C:
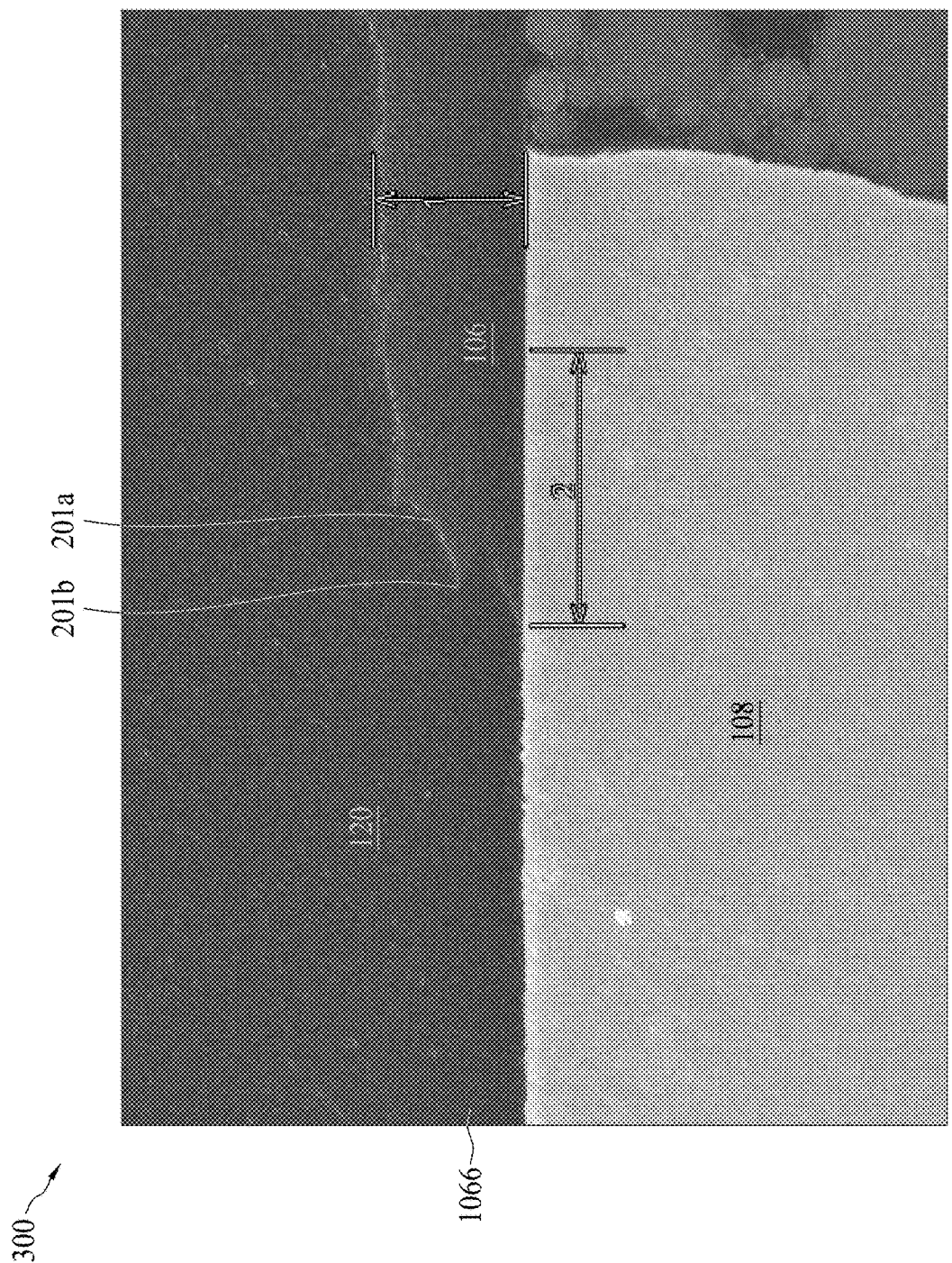
FIG. 1C is a cross sectional diagram illustrating the detailed portion of the hole in FIG. 1A according to some embodiments.
Figure 1D:
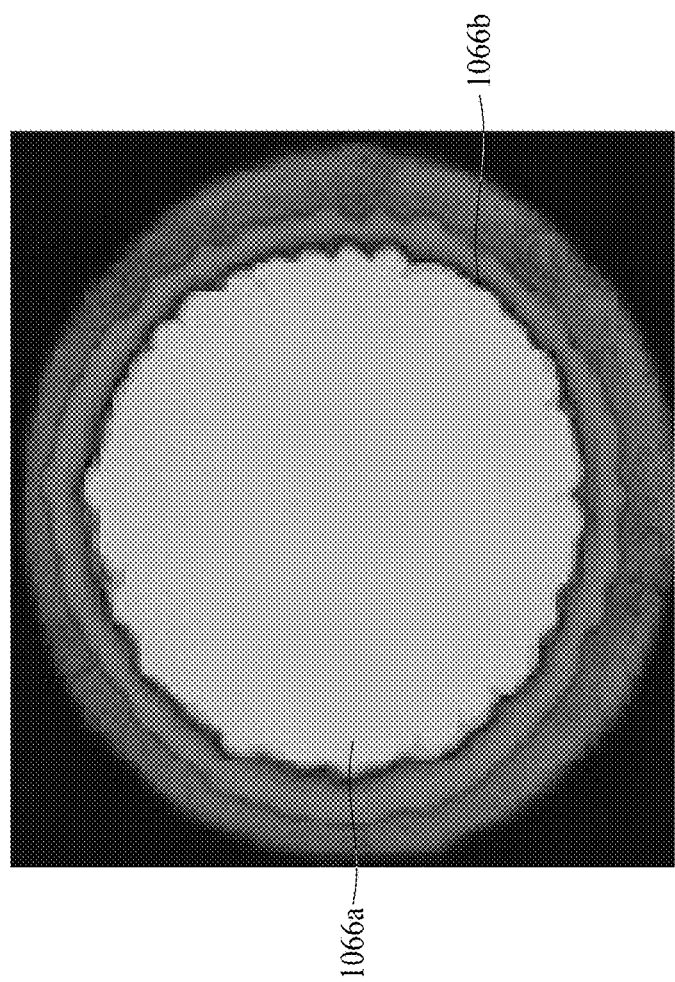
FIG. 1D is a diagram illustrating a top view of a hole according to a related art.

FIG. 1C is a cross sectional diagram illustrating the detailed portion 122 of the hole 1066 in FIG. 1A according to some embodiments. It can be seen that the hole 1066 is opened on the via 108 by drilling the second dielectric layer 106. On the sidewall 201a of the hole 1066, a protrusion 201b protrude from the sidewall 201a of the hole 1066. The protrusion 201b is caused by laser during the drilling operation. It is noted that, in FIG. 1C, some portion of the second dielectric layer 106 is disposed on the surface of the via 108 such that the diameter W2 of the hole 1066 may be smaller than the diameter W1 of the via 108. However, the portion of the second dielectric layer 106 may be removed by the laser to adjust the diameter W2 of the hole 1066.

For the comparison purpose, a counterpart of hole formed by a related art is showed in FIG. 1C. FIG. 1C is a diagram illustrating a top view of a hole 1066a according to a related art. In FIG. 1C, the hole 1066a is surrounded by surrounded by the ultra-low cure polybenzoxazole (PBO). It can be seen that the sidewall 1066b of the hole 1066a is has a relatively rough sidewall in comparison to the sidewall 201a of the hole 1066 in the present embodiment. Moreover, the diameter W2' of the hole 1066a is about 150 um, which is smaller than the diameter W2 of the hole 1066.

Figure 2:
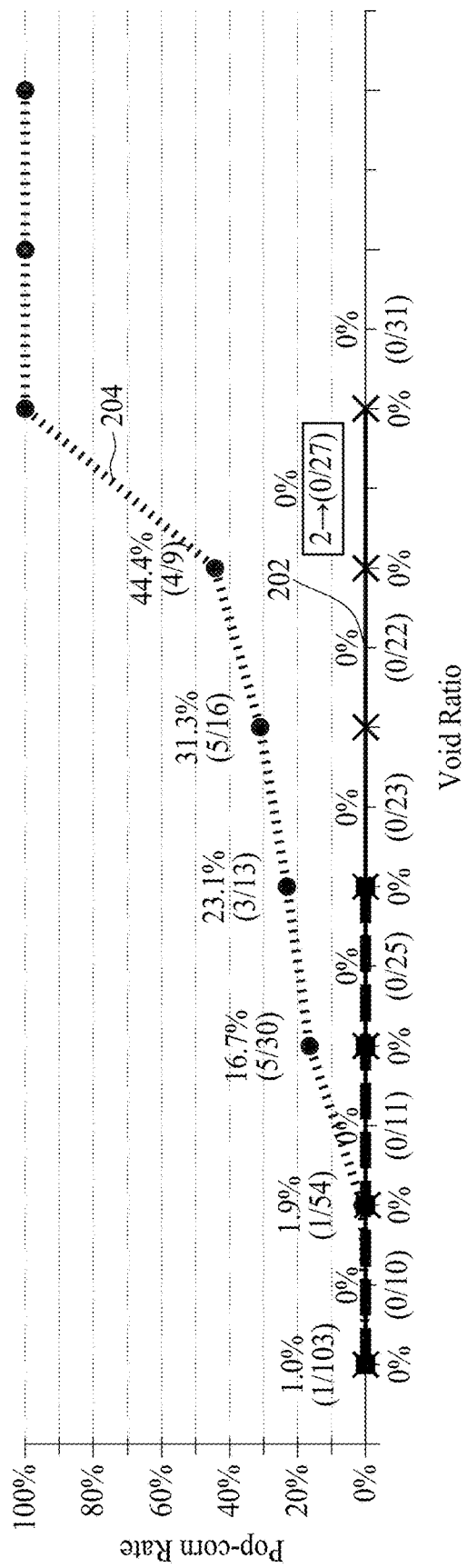
FIG. 2 is a diagram illustrating a comparison of the popcorn issues between an experimental semiconductor package device and a semiconductor device in accordance with some embodiments.

FIG. 2 is a diagram illustrating a comparison of the popcorn issues between the experimental semiconductor package device and the semiconductor device 100 in accordance with some embodiments. X-axis indicates the percentage of underfill void ratio in the filling material. Y-axis indicates the percentage of fail rate corresponding to the percentage of underfill void ratio. Curve 202 is the variation of the percentage of fail rate corresponding to the percentage of underfill void ratio of the semiconductor device 100. Curve 204 is the variation of the percentage of fail rate corresponding to the percentage of underfill void ratio of the experimental semiconductor package device. It can be seen that the percentage of fail rate of the experimental semiconductor package device starts rising at about 1.9% of underfill void ratio, and the percentage of fail rate reaches 100% when the percentage of underfill void ratio is up to 8%. On the contrary, the percentage of fail rate of the semiconductor device 100 is kept at nearly 0% even the percentage of underfill void ratio is up to 8%. Accordingly, the semiconductor device 100 has better reliability in resisting the popcorn issue in comparison to the experimental semiconductor package device.

Figure 3:
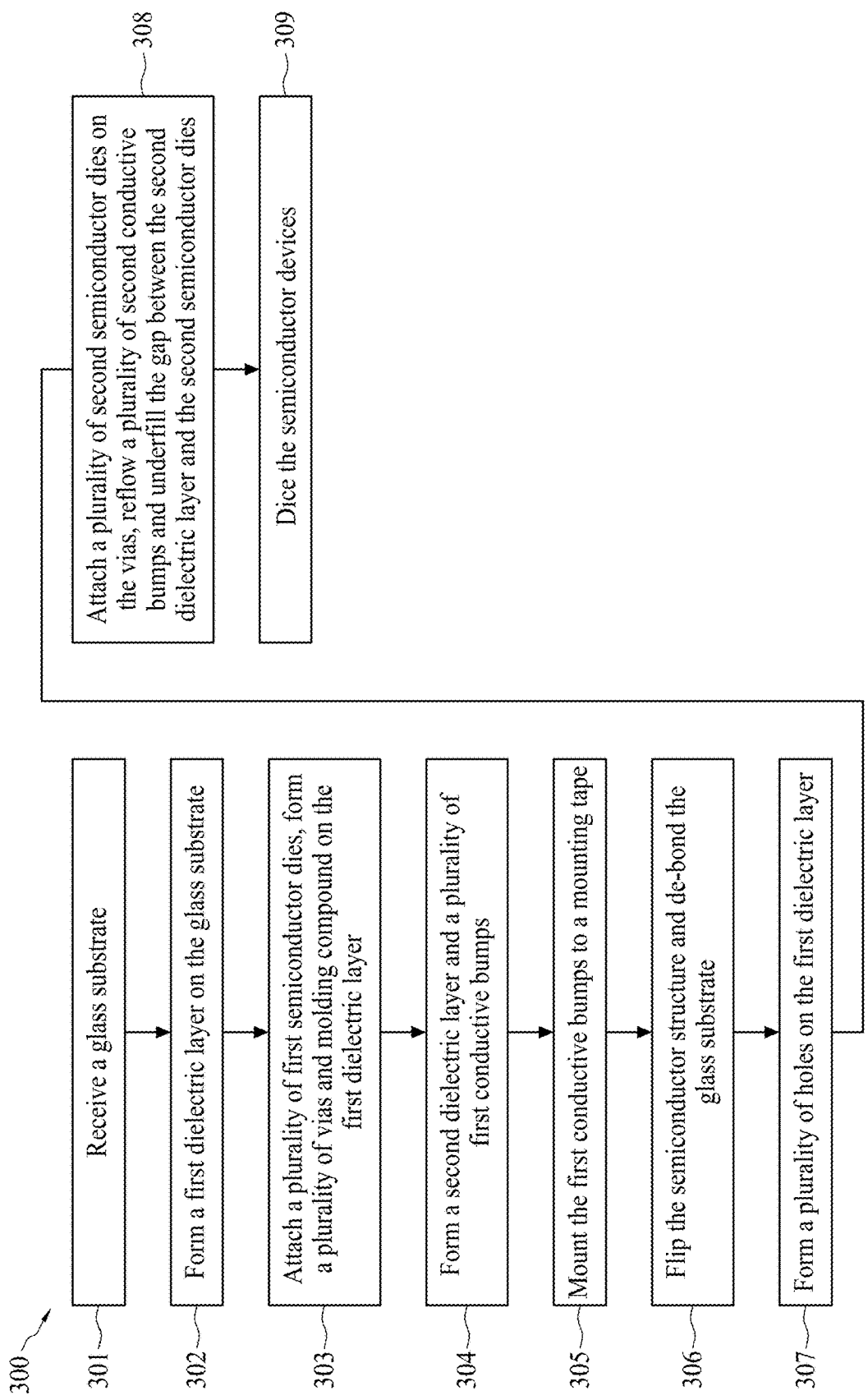
FIG. 3 is a flow diagram illustrating a method of fabricating a semiconductor device in accordance with some embodiments.

FIG. 3 is a flow diagram illustrating a method 300 of fabricating the semiconductor device 100 in accordance with some embodiments. The method 300 includes several operations, which are discussed in detail with reference to FIGS. 4 to 12. The method 300 is a wafer-level operation for fabricating a wafer-level packaging semiconductor device. However, for brevity, FIGS. 4 to 12 merely show a portion of the cross-sectional view of the device during the fabrication. At operation 301, a glass substrate is provided. A light to heat conversion (LTHC) layer is disposed on the glass substrate. The glass substrate may be regarded as a carrier of the following semiconductive structure. At operation 302, a first dielectric layer is disposed on the glass substrate via the light to heat conversion layer. The first dielectric layer is an inter-metal dielectric layer. For example, the first dielectric layer may be a low-temperature polyimide layer. In operation 303, a plurality of first semiconductor dies or chips are attached on the first dielectric layer. A plurality of vias are formed on the first dielectric layer. A molding compound is arranged to surround the first semiconductor dies and the vias. In operation 304, a second dielectric layer is formed on the first semiconductor dies, the vias, and the molding compound. A plurality of first conductive bumps are formed on the second dielectric layer. In operation 305, the first conductive bumps are mounted to a mounting tape for holding the semiconductive structure. In operation 306, the semiconductor structure is flipped, and the glass substrate is de-bonded/removed from the first dielectric layer. In operation 307, a plurality of holes are formed on the first dielectric layer. The holes may be drilled by laser. The holes are arranged to expose the vias respectively. The widths of the holes can be precisely controlled by the laser. In operation 308, a plurality of second semiconductor dies or chips are attached on the vias through a plurality of second conductive bumps. The second conductive bumps are disposed in the holes of the first dielectric layer respectively. In operation 308, the second conductive bumps are reflowed to fill the holes respectively. The second conductive bumps are protruded from the first dielectric layer. A filling material, i.e. an underfill, is arranged to fill the gap between the first dielectric layer and the second semiconductor dies by the capillarity effect. In operation 309, the semiconductor devices are diced into a plurality of separated semiconductor devices. The separated semiconductor devices are picked up and put into a tray.

The term "received" is used in the present paragraph to describe an operation of locating an object to a specific site such as a chuck. The receiving operation includes various steps and processes and varies in accordance with the features of embodiments. In some embodiments, a receiving operation includes holding a semiconductor substrate or a wafer for further spinning motion. In certain embodiments, a receiving operation includes spinning a semiconductor substrate or a wafer in a vacuum condition.

FIGS. 4 to 12 have been simplified for a better understanding of the inventive concepts of the present disclosure.

Figure 4:
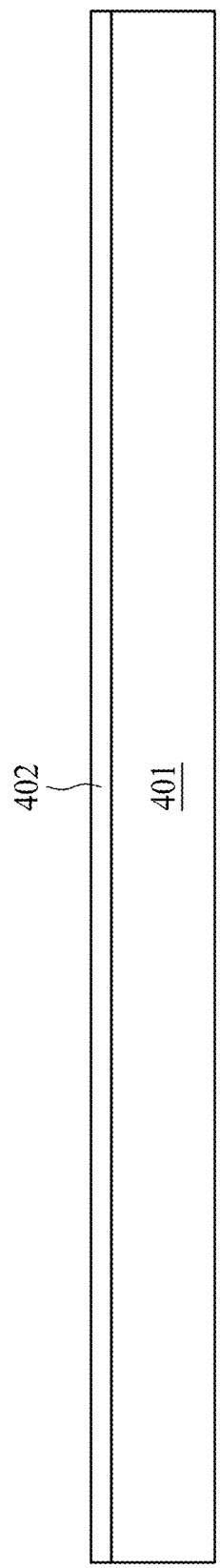
FIGS. 4 to 12 are cross-sectional views corresponding to various operations 301 to 309 in FIG. 3.

Referring to FIG. 4, in operation 301, a glass substrate 401 is provided. A surface of the glass substrate 401 is disposed by a light to heat conversion layer 402. The light to heat conversion layer 402 comprises a material that absorbs a desired wavelength of radiation and converts at least a portion of the incident radiation to heat. The glass substrate 401 is used to be a carrier for the following semiconductive structure.

Figure 5:
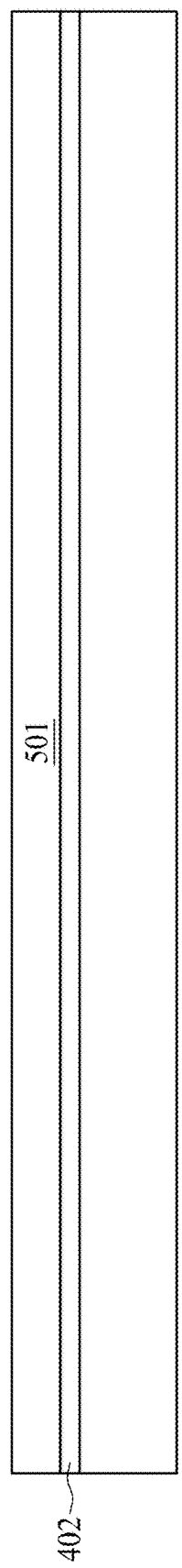

Referring to FIG. 5, in operation 302, a first dielectric layer 501 is coated on the light to heat conversion layer 402. According to some embodiments, the first dielectric layer 501 is the back side inter-metal dielectric layer of the semiconductor device. The first dielectric layer 501 is a low-temperature polyimide layer.

Figure 6:
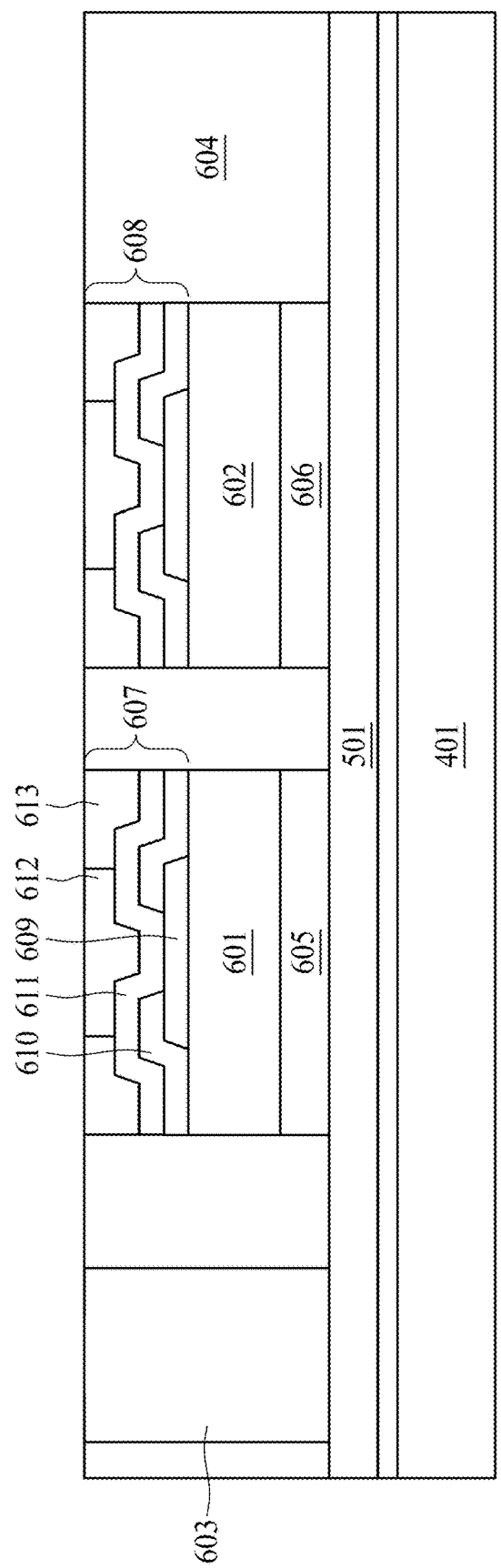

Referring to FIG. 6, in operation 303, a plurality of first semiconductor dies or chips 601, 602, a plurality of vias 603, and a molding compound 604 are formed on the first dielectric layer 501. The first semiconductor dies 601, 602 are attached to the first dielectric layer 501 via the die attached films (DAF) 605, 606 respectively. Inter-metal dielectric layers 607, 608 are formed on the first semiconductor dies 601, 602 respectively. According to some embodiments, the die attached films 605, 606, the first semiconductor dies 601, 602, and the inter-metal dielectric layers 607, 608 can be regarded as an interposer circuitry. Therefore, the vias 603 are through-interposer-vias (TIV). The material of the vias 603 may be composed of copper. Each of the inter-metal dielectric layers 607, 608 comprises an aluminum pad 609, a passivation layer 610, a conductive path 611, a copper via 612, and a polymer layer 613. The aluminum pad 609 is disposed on the first semiconductor die 601. The passivation layer 610 is disposed on the first semiconductor die 601 and the aluminum pad 609. The passivation layer 610 has an opening on the aluminum pad 609. The conductive path 611 is disposed on the passivation layer 610 and contacted the aluminum pad 609 via the opening. The copper via 612 is disposed on the conductive path 611. The polymer layer 613 is disposed on the conductive path 611. The molding compound 604 is disposed on the first dielectric layer 501 for surrounding the vias 603 and the interposer circuitries.

Figure 7:
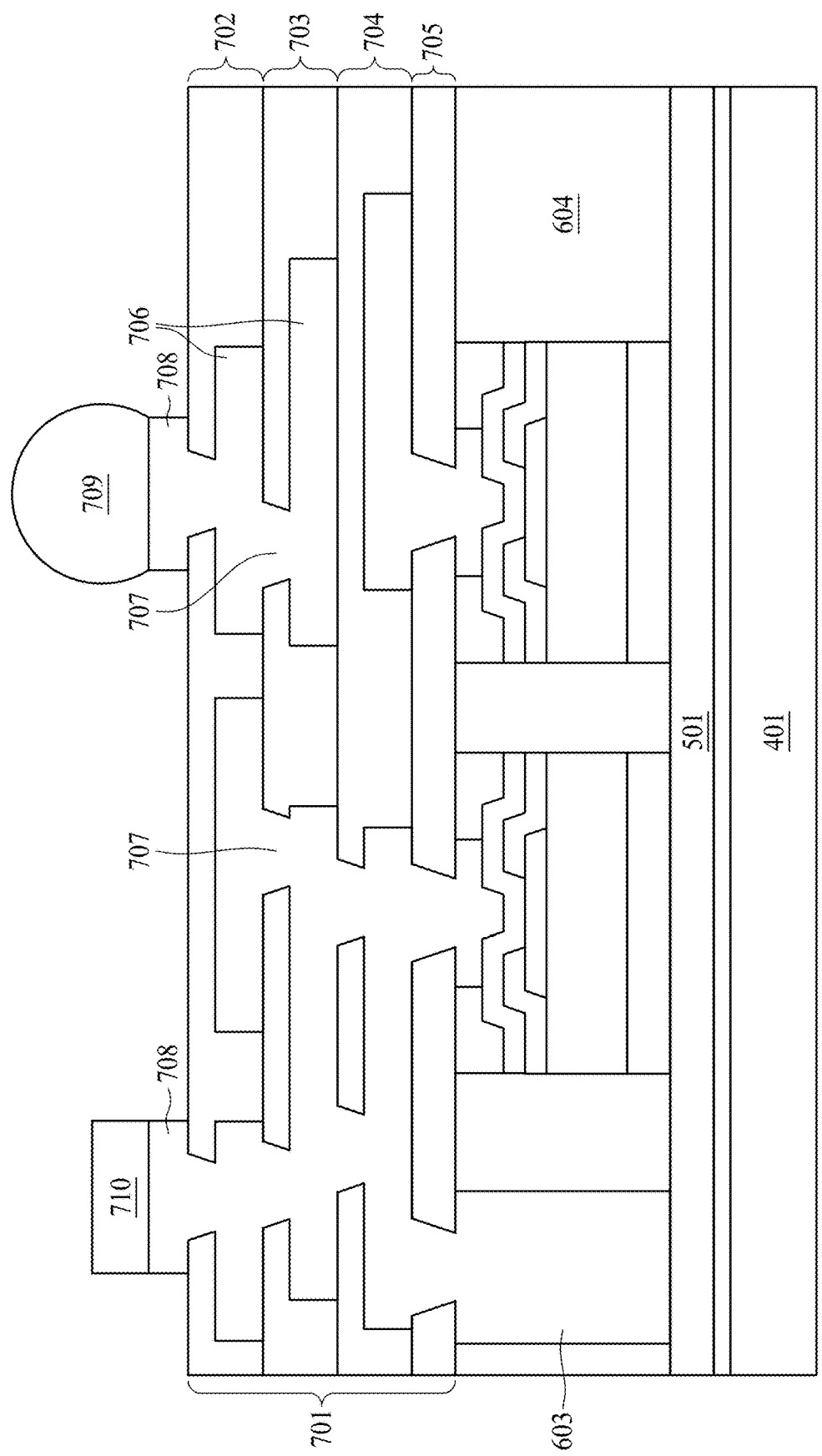

Referring to FIG. 7, in operation 304, a second dielectric layer 701 is formed on the interposer circuitries, the vias 603, and the molding compound 604. The second dielectric layer 701 is an inter-metal dielectric layer. For example, the second dielectric layer 701 is the front side inter-metal dielectric layer of the semiconductor device. The second dielectric layer 701 comprises a plurality of dielectric layers 702~705. A plurality of conductive paths or redistribution layers (RDL) 706 are formed in the dielectric layers. A plurality of vias 707 are formed to connect two conductive paths 706 in different layers. A plurality of under bump metallizations (UBM) 708 may be formed on the top surface of the second dielectric layer 701. A plurality of first conductive bumps 709 and a plurality of integrated passive devices (IPD) 710 may be disposed on the under bump metallizations 708.

Figure 8:
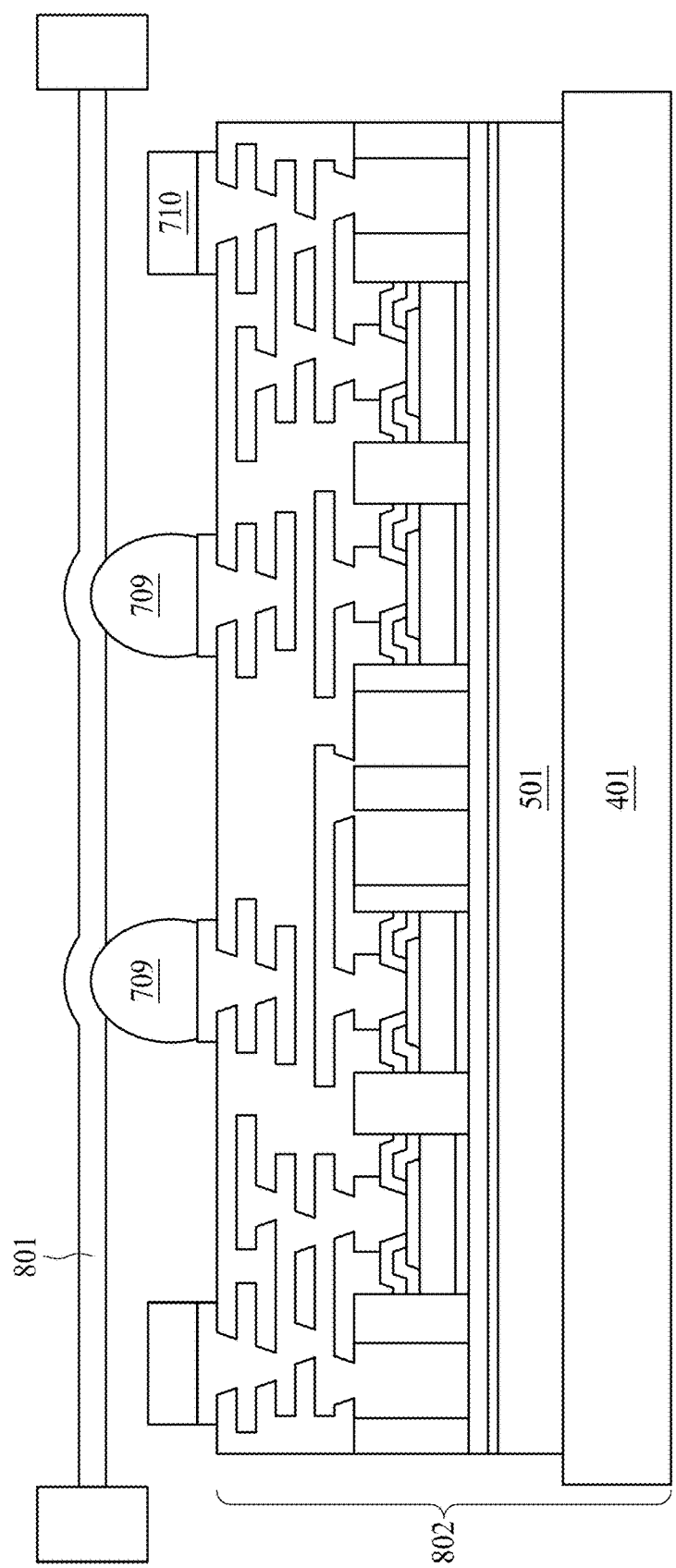

Referring to FIG. 8, in operation 305, a mounting tape 801 is attached or mounted to the first conductive bumps 709 for holding the wafer-level semiconductive structure 802. According to some embodiments, the first conductive bumps 709 are taller than the integrated passive devices (IPD) 710, thus only the first conductive bumps 709 are mounted to the mounting tape 801. However, this is not a limitation of the present invention.

Figure 9:
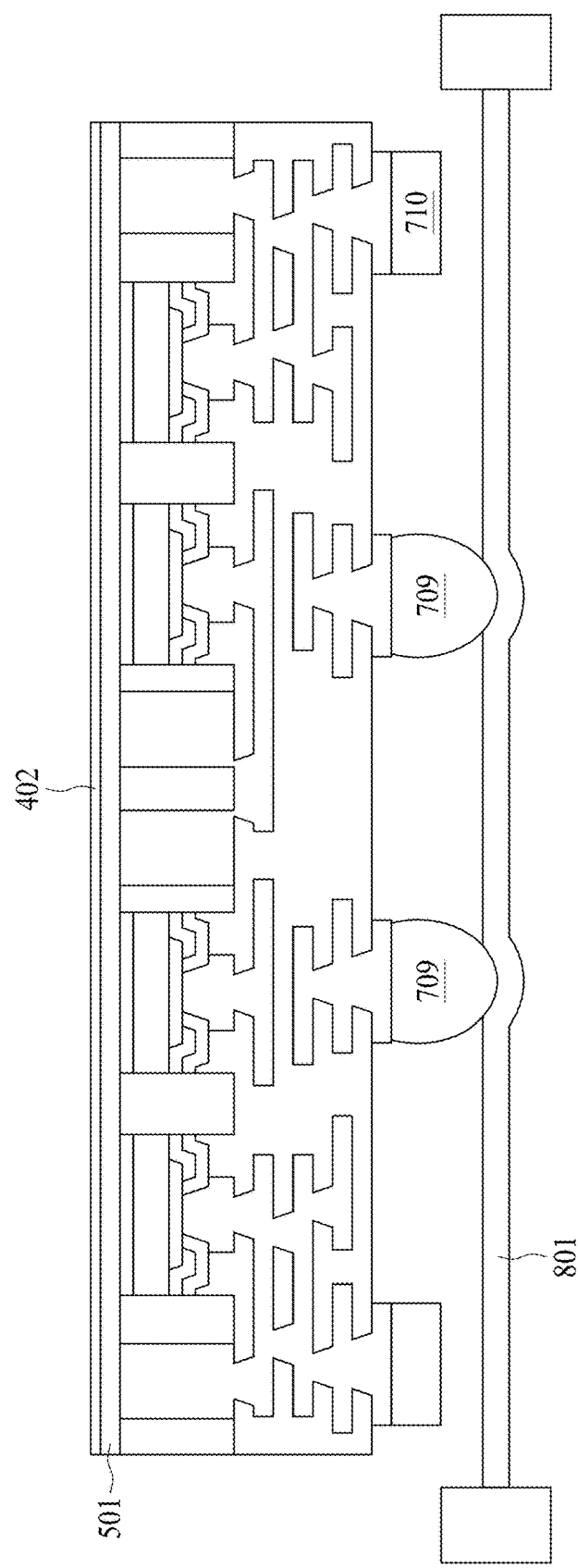

Referring to FIG. 9, in operation 306, the wafer-level semiconductive structure 802 is flipped and supported by the mounting tape 801. When the wafer-level semiconductive structure 802 is supported by the mounting tape 801, the glass substrate 401 is de-bonded from the first dielectric layer 501. When the glass substrate 401 is removed from the first dielectric layer 501, the light to heat conversion layer 402 is exposed. In this embodiment, the light to heat conversion layer 402 is not removed from the surface of the first dielectric layer 501. However, this is not a limitation of the present invention. The light to heat conversion layer 402 may be removed in the operation 306.

Figure 10:
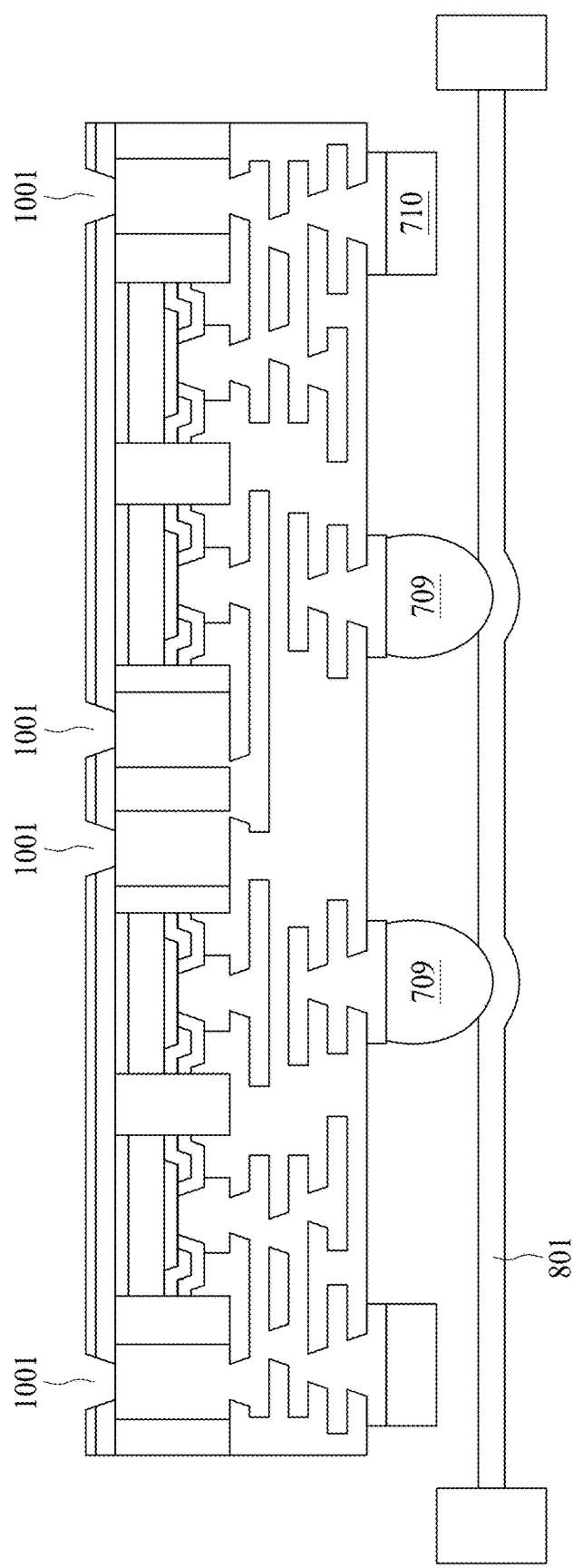

Referring to FIG. 10, in operation 307, a plurality of holes or openings 1001 are formed on the first dielectric layer 501. According to some embodiments, the holes 1001 are drilled by laser. However, this is not a limitation of the present invention. The holes 1001 are arranged to expose the vias 603 respectively. In this embodiment, the width of the hole 1001 is smaller than the width of the via 603. However, this is not a limitation of the present invention. The width of the hole 1001 may be equal to or greater than the width of the via 603.

Figure 11:
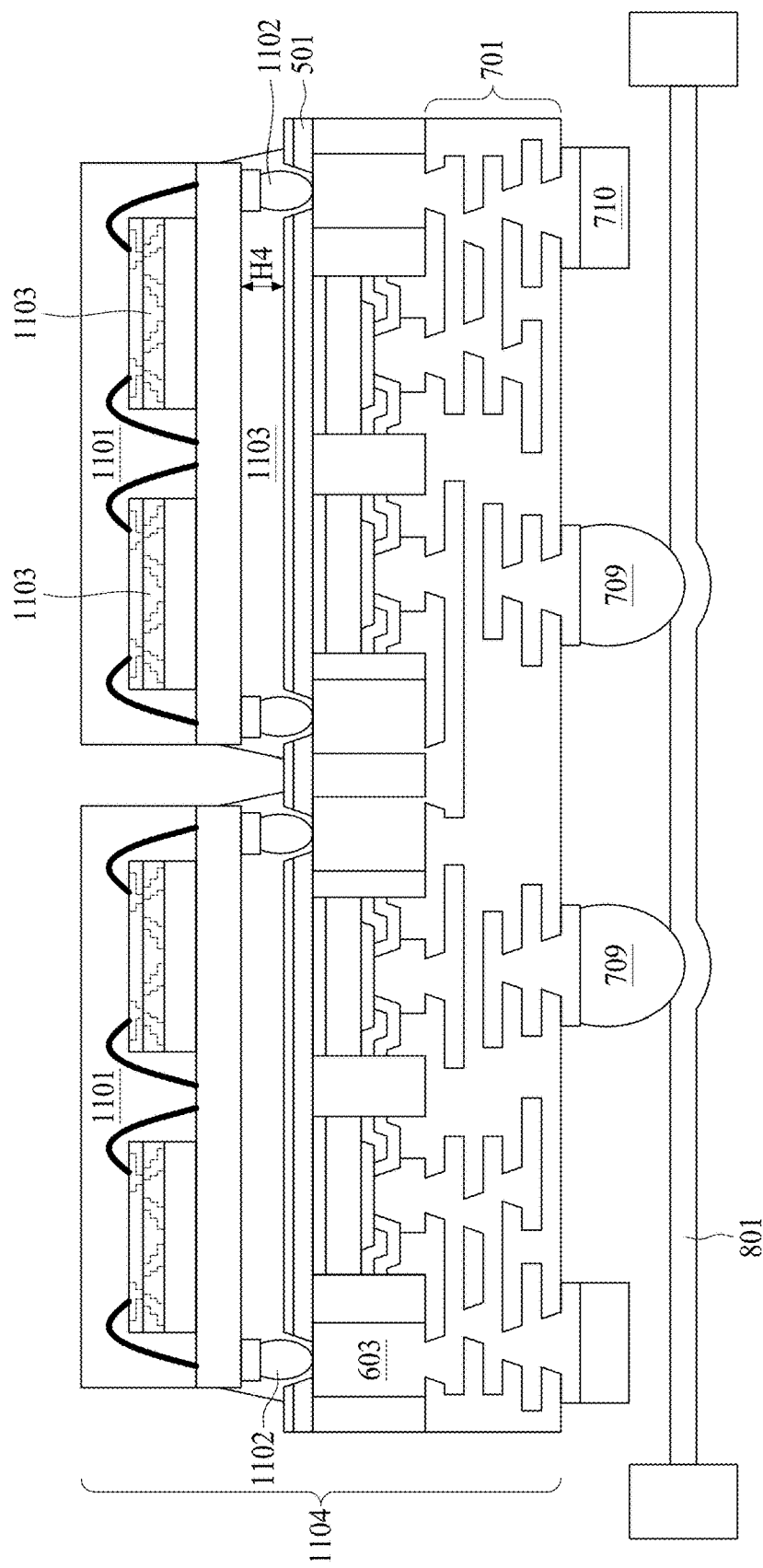

Referring to FIG. 11, in operation 308, a plurality of second semiconductor dies or chips 1101 are attached on the vias 603 through a plurality of second conductive bumps 1102. The second conductive bumps 1102 are disposed in the holes 1101 to contact with the vias 603 respectively. Each of the second semiconductor dies 1101 may comprise a plurality of DRAM modules 1103. When the second conductive bumps 1102 are attached on the vias 603, a reflow operation is performed upon the second conductive bumps 1102.

As the front side dielectric layer (i.e. 701) and the back side dielectric layer (501) of the semiconductor structure 1104 are composed of the same material (i.e. the low-temperature polyimide), the coefficient of thermal expansions of the front side dielectric layer and the back side dielectric layer of the semiconductor structure 1104 are substantially the same. Therefore, the wafer-level semiconductor structure 1104 has no noticeable warpage during the reflow operation. Accordingly, the second conductive bumps 1102 can firmly attach to the second vias 603 and the second semiconductor dies 1101 without the popcorn issue during the reflow operation.

Figure 12:
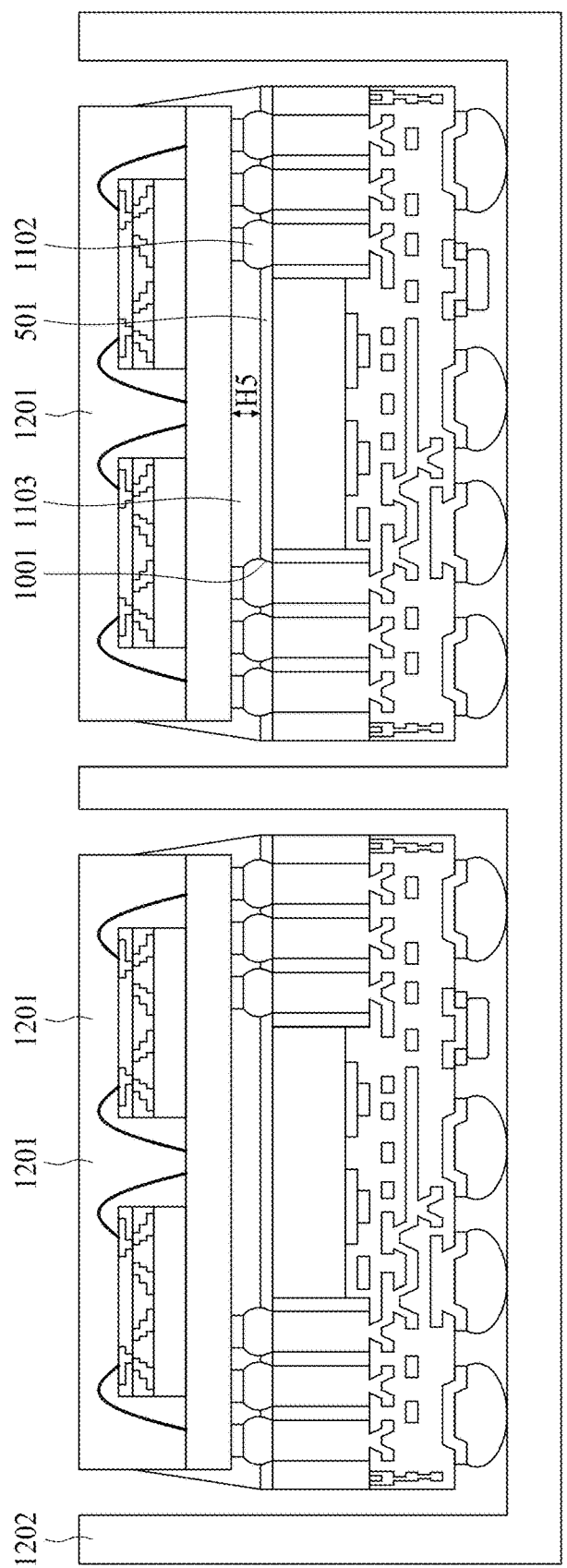

After the second conductive bumps 1102 are reflowed, the second conductive bumps 1102 may fill in the holes 1101 respectively (see FIG. 12). Moreover, the gap between the second semiconductor dies 1101 and the first dielectric layer 501 is also reduced, i.e. from the gap height H4 of FIG. 11 to the gap height H5 of FIG. 12. It is noted that the second conductive bumps 1102 still protrude from the first dielectric layer 501 after the reflow operation. In addition, a filling material 1103, i.e. an underfill, is arranged to fill the gap between the first dielectric layer 501 and the second semiconductor dies 1101 by the capillarity effect. When the gap height is reduced to a relatively small height, e.g. 93 um, the filling material 1103 has relatively low void ratio or moisture formed between the second semiconductor dies 1101 and the first dielectric layer 501 because the filling material 1103 has better capillarity effect and underfill fluidity during the filling operation. Accordingly, the popcorn package cracking issue caused by the void or moisture in the filling material 1103 can be avoided.

Moreover, when the gap height between the second semiconductor dies 1101 and the first dielectric layer 501 is reduced, the quantity or dispense amount of filling material 1103 used to fill the gap between the second semiconductor dies 1101 and the first dielectric layer 501 is also reduced.

Referring to FIG. 12, in operation 309, a dicing operation is performed upon the wafer-level semiconductor structure. A plurality of separated semiconductor devices 1201 are obtained. The separated semiconductor devices 1201 are picked up from the mounting tape 801 and put into a tray 1202. According to FIG. 12, the second conductive bumps 1102 are deformed to fill in the holes 1001 respectively.

According to the operations 301-309, the semiconductor device 1201 (i.e. 100) having the similar coefficient of thermal expansions on the front side dielectric layer and the back side dielectric layer is fabricated. As described in above paragraphs, the semiconductor device 1201 has better reliability in resisting the popcorn issue in comparison to the experimental semiconductor package device. Moreover, when the gap height (i.e. the second height H5) between the second semiconductor dies 1101 and the first dielectric layer 501 is reduced, the quantity or dispense amount of filling material 1103 used to fill the gap is also reduced. Accordingly, the material cost of the semiconductor device 1201 can be reduced.

In some embodiments, a semiconductor device is provided. The semiconductor device comprises: a first dielectric layer having a first surface; a molding compound disposed on the first surface of the first dielectric layer; a second dielectric layer having a first surface disposed on the molding compound; a via disposed in the molding compound; and a first conductive bump disposed on the via and surrounded by the second dielectric layer. The first dielectric layer and the second dielectric layer are composed of the same material.

In some embodiments, a semiconductor device is provided. The semiconductor device comprises: a first dielectric layer having a first surface; a molding compound disposed on the first surface of the first dielectric layer; a second dielectric layer having a first surface disposed on the molding compound; a via disposed in the molding compound; and a first conductive bump disposed on the via and surrounded the second dielectric layer. The first dielectric layer and the second dielectric layer have substantially the same thermal expansion coefficient (CTE).

In some embodiments, a method of manufacturing a semiconductor device is provided. The method comprises: forming a via, a first semiconductor die, and a molding compound on a first dielectric layer, wherein the molding compound is arranged to mold the via and the first semiconductor die; forming a second dielectric layer on the via, the first semiconductor die, and the molding compound; forming a first conductive bump on the second dielectric layer; forming a hole on the first dielectric layer; and disposing a second conductive bump of a second semiconductor die on the hole. The first dielectric layer and the second dielectric layer are composed of the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first dielectric layer, having a first surface;
   a molding compound, disposed on the first surface of the first dielectric layer, the molding compound having a top surface;
   a second dielectric layer, having a recess and a first surface disposed on the top surface of the molding compound;
   a via, disposed in the molding compound, the via having a top surface coplanar to the top surface of the molding compound;
   a semiconductor die;
   a first conductive bump, having a top surface protruding the second dielectric layer, and a bottom surface directly in contact with the top surface of the via and surrounded by the second dielectric layer, the top surface of the first conductive bump being attached to a bottom of the semiconductor die, the first conductive bump contacted between the top surface of via and the bottom of the semiconductor die completely filling the recess;
   a filling material, disposed on the second dielectric layer, the filling material arranged to surround the first conductive bump;
   wherein the first conductive bump is a homogeneous conductive bump, and the first dielectric layer and the second dielectric layer are composed of the same material;
   another semiconductor die, disposed in the molding compound. having a first surface facing the first surface of the first dielectric layer; and a second surface coplanar with the top surfaces of the via and the molding compound.

2. The semiconductor device of claim 1, wherein the first dielectric layer and the second dielectric layer are composed of low temperature polyimide.

3. The semiconductor device of claim 1, wherein the via is aligned with the first conductive bump in a vertical direction, the via has a first diameter and the first conductive bump in the second dielectric layer has a second diameter, and the first diameter equals or greater than the second diameter.

4. The semiconductor device of claim 1, wherein the first dielectric layer further comprises a second surface opposite to the first surface of the first dielectric layer, and the second dielectric layer further comprises a second surface opposite to the first surface of the second dielectric layer; the semiconductor device further comprises:
a second conductive bump, disposed on the second surface of the first dielectric layer.

5. The semiconductor device of claim 1, wherein a width of a top portion of the recess of the second dielectric layer is greater than a width of a bottom portion of the recess of the second dielectric layer.

6. The semiconductor device of claim 5, wherein the filling material is disposed between the second dielectric layer and the semiconductor die.

7. The semiconductor device of claim 1, wherein the second dielectric layer is arranged to form a hole drilled by laser for receiving the first conductive bump, and the hole has a smooth sidewall.

8. A semiconductor device, comprising:
a first dielectric layer, having a first surface;
a molding compound, disposed on the first surface of the first dielectric layer, the molding compound having a top surface;
a second dielectric layer, having a recess and a first surface disposed on the top surface of the molding compound;
a via, disposed in the molding compound, the via having a top surface coplanar to the top surface of the molding compound;
a semiconductor die;
a first conductive bump, having a top surface protruding the second dielectric layer, and a bottom surface directly in contact with the top surface of the via and surrounded the second dielectric layer, the top surface of the first conductive bump being attached to a bottom of the semiconductor die, the first conductive bump contacted between the top surface of via and the bottom of the semiconductor die completely filling the recess;
a filling material, disposed on the second dielectric layer, the filling material arranged to surround the first conductive bump;
wherein the first conductive bump is a homogeneous conductive bump, and the first dielectric layer and the second dielectric layer have the same thermal expansion coefficient (CTE);
another semiconductor die, disposed in the molding compound, having a first surface facing the first surface of the first dielectric layer; and
and a second surface coplanar with the top surfaces of the via and the molding compound.

9. The semiconductor device of claim 8, wherein the first dielectric layer and the second dielectric layer are composed of low-temperature polyimide.

10. The semiconductor device of claim 8, wherein the via is aligned with the first conductive bump in a vertical direction, the via has a first diameter and the first conductive bump in the second dielectric layer has a second diameter, and the first diameter equals or greater than the second diameter.

11. The semiconductor device of claim 8, wherein the first dielectric layer further comprises a second surface opposite to the first surface of the first dielectric layer, and the second dielectric layer further comprises a second surface opposite to the first surface of the second dielectric layer; the semiconductor device further comprises:
a second conductive bump, disposed on the second surface of the first dielectric layer.

12. The semiconductor device of claim 11, further comprising:
a conductive path, formed in the first dielectric layer;
wherein the conductive path is arranged to electrically connect the via and the second conductive bump.

13. The semiconductor device of claim 12, wherein the filling material is disposed between the second dielectric layer and the semiconductor die.

14. The semiconductor device of claim 13, wherein the second dielectric layer is arranged to have a hole for receiving the first conductive bump, the hole has a diameter, the via is arranged to have a width, and the width of the via is equal to the diameter of the hole.

15. A method of manufacturing a semiconductor device, comprising:
forming a via, a first semiconductor die, and a molding compound on a first dielectric layer, wherein the molding compound is arranged to mold the via and the first semiconductor die;
forming a second dielectric layer on the via, the first semiconductor die, and the molding compound;
forming a first conductive bump on the second dielectric layer;
forming a hole on the first dielectric layer to expose a top surface of the via, wherein the top surface of the via, a top surface of the molding compound and a surface of the first semiconductor die are coplanar;
directly contacting a bottom surface of a second conductive bump of a second semiconductor die on the top surface of the via in the hole;
reflowing the second conductive bump contacted between the via on the first dielectric layer and a bottom the second semiconductor die until the hole is completely filled; and
wherein the second conductive bump is a homogeneous conductive bump, and the first dielectric layer and the second dielectric layer are composed of the same material.

16. The method of claim 15, further comprising:
mounting the first conductive bump to a mounting tape; and
disposing a filling material in between the first dielectric layer and the second semiconductor die.

17. The method of claim 15, wherein the hole is aligned with the via.

18. The method of claim 15, wherein the first dielectric layer and the second dielectric layer are composed of low temperature polyimide.

* * * * *